(12) United States Patent
Konchitsky (10) Patent No.: US 9,847,092 B2
(45) Date of Patent: Dec. 19, 2017

(54) METHODS AND SYSTEM FOR WIDEBAND SIGNAL PROCESSING IN COMMUNICATION NETWORK

(71) Applicant: Alon Konchitsky, Santa Clara, CA (US)

(72) Inventor: Alon Konchitsky, Santa Clara, CA (US)

(*) Notice: Subject to any disclaimer, the term of this patent is extended or adjusted under 35 U.S.C. 154(b) by 0 days.

(21) Appl. No.: 14/538,029

(22) Filed: Nov. 11, 2014

(65) Prior Publication Data

US 2015/0071462 A1    Mar. 12, 2015

Related U.S. Application Data

(63) Continuation-in-part of application No. 13/325,839, filed on Dec. 14, 2011, now Pat. No. 8,903,107.

(60) Provisional application No. 61/426,116, filed on Dec. 22, 2010.

(51) Int. Cl.
*H04B 15/00* (2006.01)
*G10L 21/034* (2013.01)
*H03G 3/30* (2006.01)
*H04R 3/00* (2006.01)
*H04R 1/10* (2006.01)

(52) U.S. Cl.
CPC ......... *G10L 21/034* (2013.01); *H03G 3/3005* (2013.01); *H04R 1/1083* (2013.01); *H04R 3/005* (2013.01); *H04R 2410/05* (2013.01); *H04R 2499/11* (2013.01)

(58) Field of Classification Search
CPC .... G10L 21/034; H03G 3/3005; H04R 3/005; H04R 1/1083; H04R 2410/05; H04R 2499/11
USPC .................. 381/94.2, 92, 94.1, 94.3
See application file for complete search history.

(56) References Cited

U.S. PATENT DOCUMENTS 6,415,034 B1 * 7/2002 Hietanen ............ G10K 11/1788
381/151

* cited by examiner

*Primary Examiner* — Paul S Kim
(74) *Attorney, Agent, or Firm* — Steven A. Nielsen; www.NielsenPatents.com (57) ABSTRACT

The embodiments herein disclose a device and a method for controlling noise in a wideband communication system. In one embodiment herein, multiple microphones for receiving wideband audio signals are provided. A processor is configured to analyze each wideband audio signal received by each microphone. Further, unique signal patterns are generated based on each analyzed wideband signals for each microphone and the unique signal patterns are compared to detect any identical signal patterns. A controller is also provided for controlling gains of those microphones that are detected to be receiving wideband audio signal of identical signal patterns.

14 Claims, 8 Drawing Sheets

METHODS AND SYSTEM FOR WIDEBAND SIGNAL PROCESSING IN COMMUNICATION NETWORK

CROSS REFERENCE TO RELATED APPLICATIONS

This utility application is a continuation in part to application Ser. No. 13/325,839 filed on Dec. 14, 2011 which claims the benefit and priority of provisional patent application 61/426,116 filed on Dec. 22, 2010.

FIELD OF THE INVENTION

The invention relates to audio signal processing and reduction of noise in signals and more specifically, the invention relates to devices and methods for reducing stochastic noise in wideband audio signals.

BACKGROUND

Background noise or ambient noise is any sound other than the sound being monitored. Typically, background noise may be caused by engines, blowers, fans, air conditioners, cars, busy intersections, people talking in restaurants etc. If untreated, background noise can be annoying at times. Further, stochastic background noise is a major problem when processing wideband audio signals.

Modern day communication devices operate in a myriad type of environments. Examples of communication devices include, but are not limited to, a mobile phone, wireless telephone and so forth. These communication devices may be narrowband or wideband depending on the sampling frequency in which they operate. Narrowband and wideband communication devices operate at 8000 Hz and 16000 Hz sampling frequency respectively. Some of the environments may be extremely noisy, for example bars, crowded restaurants and so forth, while some environments may be extremely quite such as home, relaxing lounge and so forth. Generally, the communication devices include microphone(s) that pick up the desired signal of the user and background noise (if present). As a result, the communication at the other end may not be clearly discernable or pleasant.

Typically for noise reduction in wideband audio signals, the audio signal is processed in a microprocessor by using noise reduction algorithms. The audio signal is picked up by the microphone, digitized by an Analog to Digital Converter (ADC) and fed to the microprocessor for analysis and noise reduction. Attempts to solve this problem have largely been unsuccessful. Traditional noise reduction systems use filters, Wiener filters and Kalman filters. However, these techniques have largely been ineffective mostly due to the fact that the systems need to have prior knowledge of the properties of noise. Other noise reduction systems use spectral subtraction. One such technique is described by Steven F. Boll in "Suppression of Acoustic Noise in Speech Using Spectral Subtraction", IEEE Transactions on Acoustics, Speech, and Signal Processing, Vol. Assp-27, No.2, April 1979 and is incorporated herein by reference. Spectral subtraction involves calculating the Fast Fourier Transform (FFT) of the audio signal, estimating the magnitude spectrum of the signal classified as "noisy speech" and subtracting the magnitude spectrum of the signal classified as "noise only", and then calculating the Inverse FFT (IFFT) of the wideband audio signal. However, the spectral subtraction technique introduces a lot of artifacts and "musical noise". It requires a continuous averaging of the noise. The technique performs well for stationary noise, where the characteristics of the noise do not vary over time. However, they do not perform well for stochastic noises which are non-deterministic, time varying and non-stationary. Examples of stochastic noises include restaurant noise, keyboard clicks, wind noise, cafeteria noise and so forth.

Single microphone and two microphone noise reduction systems have been attempted. For example, U.S. Pat. No. 6,415,034 to Hietanen et al patent describes the use of a second background noise microphone located within an earphone unit or behind an ear capsule. Digital signal processing is used to create a noise canceling signal which enters the speech microphone. Unfortunately, the effectiveness of the method disclosed in the Hietanen et al patent is compromised by acoustical leakage that is where the ambient or environmental noise leaks past the ear capsule and into the speech microphone. The Hietanen et al patent also relies upon complex and power consuming expensive digital circuitry that may generally not be suitable for small portable battery powered devices such as pocket able cellular telephones, Bluetooth headsets, cordless phones and so forth.

Another example is U.S. Pat. No. 5,969,838 (the "Paritsky patent") which discloses a noise reduction system utilizing two fiber optic microphones that are placed side-by-side next to one another. Unfortunately, the Paritsky patent discloses a system using light guides and other relatively expensive and/or fragile components not suitable for the rigors of cellular telephones, Bluetooth headsets, cordless phones and so forth.

U.S. Pat. No. 5,406,622 to Silverberg et al uses two adaptive filters, one driven by the handset transmitter to subtract speech from a reference value to produce an enhanced reference signal; and a second adaptive filter driven by the enhanced reference signal to subtract noise from the transmitter. Silverberg et al require accurate detection of speech and non-speech regions. Any incorrect detection will degrade the performance of the system.

In light of the above discussion, techniques are required to reduce the stochastic noise in a wideband audio signal.

SUMMARY OF THE INVENTION

The present invention provides a novel system, device and method for monitoring the stochastic noise in a wideband audio signal the environment in which the communication device is operating and reducing the stochastic wideband noise before it is transmitted to the other party.

In one aspect, the invention reduces the stochastic wideband noise in a transmitting signal by using two microphones.

In another aspect, the invention reduces the stochastic noise in a wideband audio signal by capturing the wideband analog audio signals using the first and second microphones, converting the analog signals to digital signals by using separate analog to digital converters, and identifying an identical digital signal pattern with continually changing properties in both of the digital signals. This identical digital signal pattern with continually changing properties is classified as "stochastic noise" signal and the gain of the first and second microphones are controlled.

In another aspect, the invention reduces the stochastic noise in a wideband audio signal by capturing the wideband analog audio signals using the first and second microphones, converting the analog signals to digital signals by using separate analog to digital converters, and identifying the presence of stochastic noise signal and, reducing the gain of the first and second microphones, if the stochastic noise signal is present; then pair the identical digital signal pattern and transmit over the communication link.

In another aspect, the invention analyzes the wideband analog audio signals captured by the first and second microphones, converts the analog signals to digital signals by using separate analog to digital converters, and identifies a dissimilar signal pattern with continuously changing properties. This dissimilar signal pattern with continuously changing properties is classified as "noisy speech", the contents of which include both stochastic noise and speech desired to be transmitted over the communication link.

In another aspect, the invention analyzes the wideband analog audio signals captured by the first and second microphones, converts the analog signals to digital signals by using separate analog to digital converters, identifies a dissimilar digital signal pattern with continuously changing properties as noisy speech; extracts and pairs the dissimilar digital signal pattern with continually changing properties and transmits over the communication link.

In another aspect, the first and second microphones are attached to different positions for capturing wideband audio signals and are physically separated from each other.

In another aspect, the invention provides a system and method of reducing stochastic noise in a wideband audio signal without prior knowledge of noise characteristics as stochastic noise is non-deterministic.

In another aspect, the invention provides a system and method of reducing stochastic noise in a wideband audio signal does not introduce artifacts and musical noise in the transmitted signal.

In another aspect of the invention, stochastic noise is reduced in a wideband audio signal in voice communication systems, devices, telephones, voice communication gateways, multi-channel environments and so forth.

In another aspect of the invention, a wideband noise control communication device is disclosed comprising multiple microphones for receiving wideband audio signals. Each microphone is placed in a separate position. A processor is configured to analyze each wideband audio signal received by each microphone and generate unique signal patterns based on each analyzed wideband signals for each microphone. The processor comprises an analog to digital converter for separately converting the wideband analog audio signals received by each microphone, into wideband digital signals. The processor further compares the unique signal patterns to detect any identical signal patterns. A controller is provided for controlling gains of the microphones that are detected to be receiving wideband audio signal of identical signal patterns. The processor analyzes the wideband digital signals and identifies if the detected identical digital signal pattern continually changes its properties.

In another aspect of the invention, the controller reduces the gains of the microphones that are detected to be receiving wideband audio signal of identical signal patterns, however, does not reduce the gains of the microphones if no identical signal pattern is detected.

In another aspect of the invention, the processor compares the signal patterns in pairs.

In another aspect of the invention, a method for controlling wideband communication noise is disclosed. The method comprises the steps of: receiving wideband audio signals via multiple microphones; configuring a processor for: analyzing each wideband audio signal received by each microphone, generating unique signal patterns based on each analyzed wideband signals for each microphone, and comparing the unique signal patterns to detect any identical signal patterns. The method further comprises the steps of controlling gains of the microphones that are detected to be receiving wideband audio signal of identical signal patterns.

Other features and advantages of the invention will become apparent to one with skill in the art upon examination of the following figures and detailed description. All such features, advantages are included within this description and be within the scope of the invention and be protected by the claims.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF EMBODIMENTS OF THE INVENTION

The following detailed description is directed to certain specific embodiments of the invention. However, the invention can be embodied in a multitude of different ways as defined and covered by the claims and their equivalents. In this description, reference is made to the drawings wherein like parts are designated with like numerals throughout. Unless otherwise noted in this specification or in the claims, all of the terms used in the specification and the claims will have the meanings normally ascribed to these terms by workers in the art.

The present invention provides a novel and unique technique to reduce stochastic wideband noise experienced in communication devices such as a cellular telephone, wireless telephone, cordless telephone, and so forth. While the present invention has applicability to at least these types of communications devices, the principles of the present invention are particularly applicable to all types of communications devices, as well as other devices that process speech in noisy environments such as voice recorders, dictation systems, voice command and control systems, and the like. For simplicity, the following description may employ the terms "telephone" or "cellular telephone" as an umbrella term to describe the embodiments of the present invention, but those skilled in the art will appreciate that the use of such term is not to be considered limiting to the scope of the invention, which is set forth by the claims appearing at the end of this description.

Figure 1:
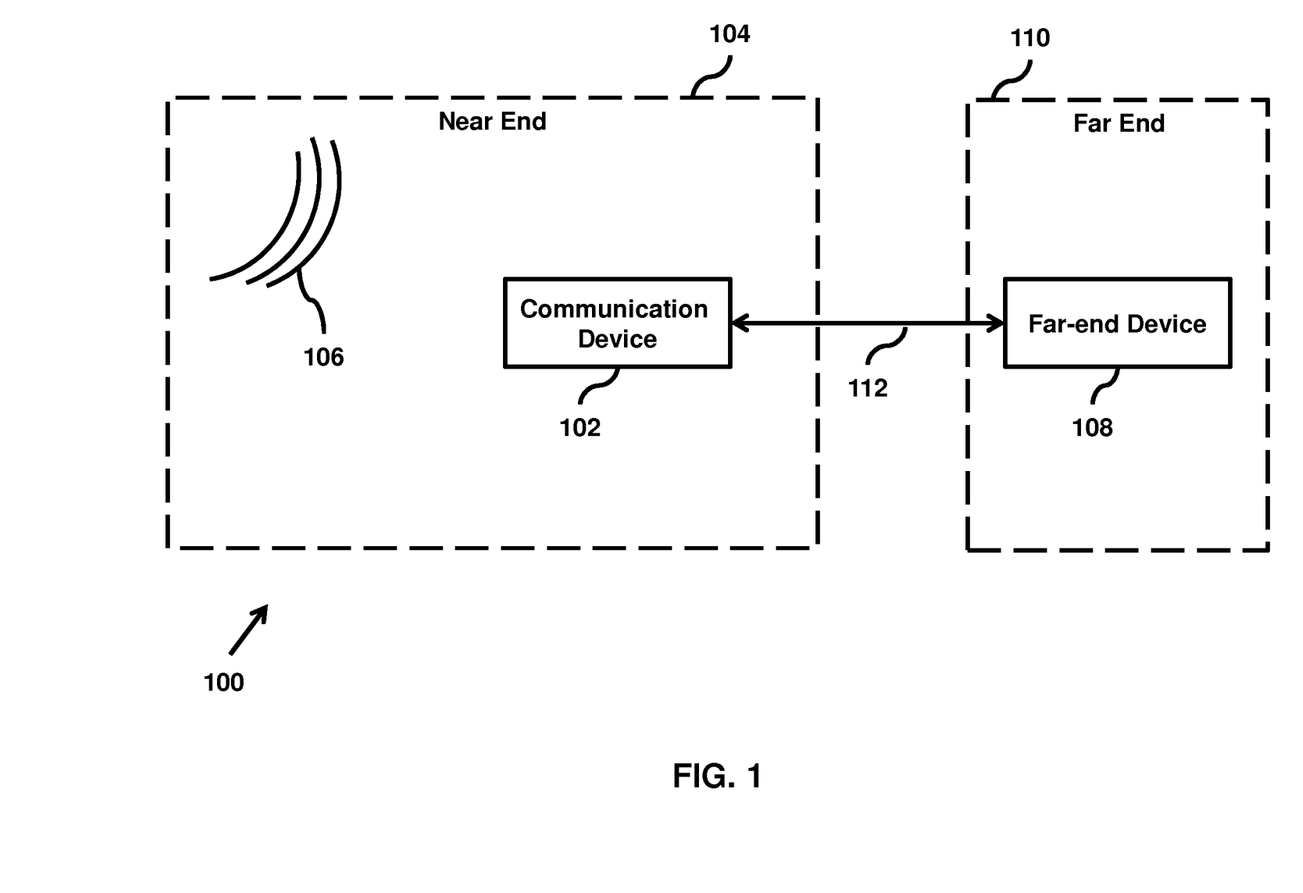
FIG. 1 illustrates an environment where various embodiments of the invention function.

FIG. 1 illustrates an environment 100 where various embodiments of the invention function. A communication device 102 may communicate with a far-end device 108 through a communication channel 112. Examples of communication device 102 and far-end device 108 include, but are not limited to, a mobile phone, a telephone, a cordless phone, a Bluetooth headset, a computer, a dictation system, voice recorders and other devices capable of communication. Communication channel 112 may be for example, a wireless channel, a radio channel, a wired channel and so forth. Communication device 102 and far-end device 108 communicate by exchanging signals over communication channel 112. Far-end device 108 may be located at a far end 110 from communication device 102, while communication device 102 may be located at a near end 104. Far end 110 may be location that is distant from near end 104 of communication device 102. For example, near end 104 may be a restaurant having local background noise 106 which may have stochastic properties. Background noise 106 may be due to talking of other people, machines or devices used inside or near the restaurant.

Figure 2:
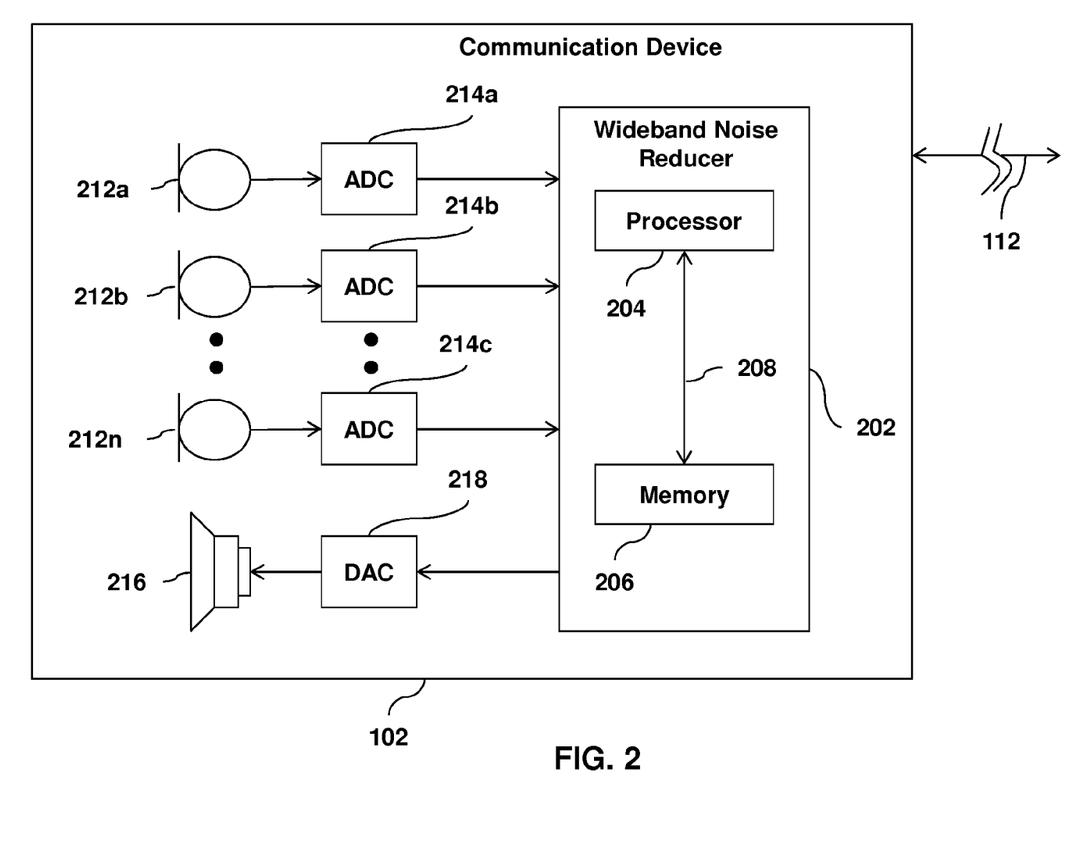
FIG. 2 illustrates a block diagram of a communication device for stochastic noise reduction in wideband audio signals, in accordance with an embodiment of the invention.

FIG. 2 illustrates a block diagram of communication device 102 for reducing stochastic noise in wideband audio signals in accordance with an embodiment of the invention. Communication device 102 may include multiple microphones 212a-n for acquiring audio signals. The audio signals acquired by microphones 212a-n may be analog and can be converted to digital audio signals by Analog-To-Digital (ADC) convertors 214a-n connected to microphones 212a-n. Microphones 212a-n may acquire audio signals from near end 104 of communication device 102. Therefore, the audio signals acquired by microphones 212a-n may include stochastic background noise.

A Digital-To-Analog (DAC) convertor 218 connected to an earpiece 216 may convert digital audio signals to analog audio signals that may then be outputted by earpiece 216. Further, communication device 102 includes receives signals from a far-end device on communication channel 112. Stochastic noise is reduced from the wideband audio signal at 202. Further, the noise reduced wideband audio signal is communicated to the far-end through the communication channel 112. Stochastic noise reduction in a wideband audio signal 202 may include a processor 204 and a memory 206. Processor 204 can be a general purpose fixed point or floating point Digital Signal Processor (DSP), or a specialized DSP (fixed point or floating point). Examples of processor 204 include, but are not limited to, processor Texas Instruments (TI) TMS320VC5510, TMS320VC6713, TMS320VC6416; Analog Devices (ADI) BlackFinn (BF) 531, BF532, 533; Cambridge Silicon Radio (CSR) Blue Core 5 Multi-media (BC5-MM) or Blue Core 7 Multi-media BC7-MM and so forth. Memory 206 can be for example, a Random Access Memory (RAM), SRAM (Static Random Access Memory), a Read Only Memory (ROM), a solid state memory, a computer readable media and so forth. Further, memory 206 may be implemented inside or outside communication device 102. Memory 206 may include instructions that can be executed by processor 204. Further, memory 206 may store data that may be used by processor 204. Processor 204 and memory 206 may communicate for data transfer through system bus 208.

Figure 3:
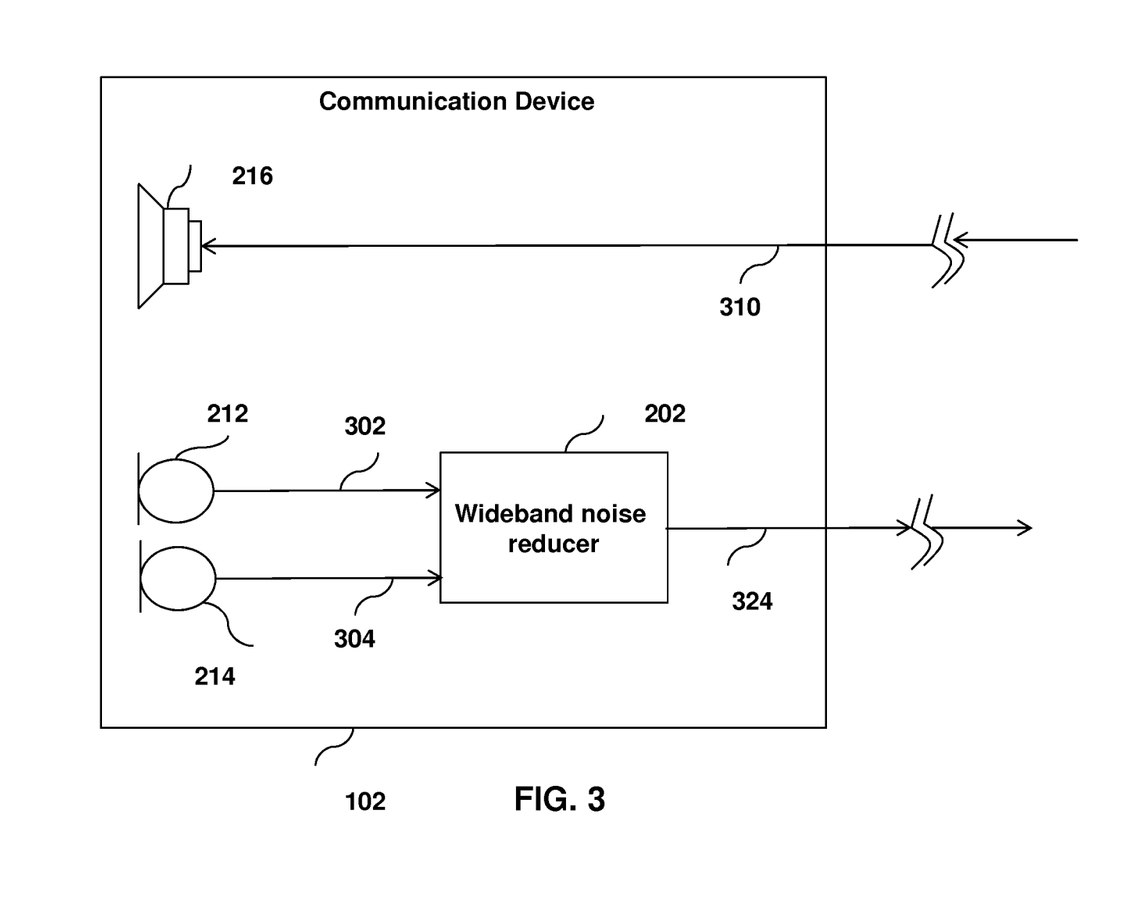
FIG. 3 illustrates acquiring and outputting of audio signals by the communication device, in accordance with an embodiment of the invention.

FIG. 3 illustrates acquiring and outputting of audio signals by communication device 102, in accordance with an embodiment of the invention. As shown, first audio signal buffer 302 is acquired from first microphone 212 and second audio signal buffer 304 is acquired from second microphone 214. Communication device 102 transmits signals to far-end device 108 based on first audio signal buffer 302 and the second audio signal buffer 304. First audio signal buffer 302 and the second audio signal buffer 304 are processed by the wideband noise reducer 202 to generate the third audio signal buffer 324 which is transmitted to the far-end device 108 through the communication link 112. The third audio signal buffer 324 is an enhanced form of the first audio signal buffer 302 and the second audio signal buffer 304 that sounds clear to the user of far-end device 108. 310 may be the signal received from the far-end device and reproduced at the earpiece 216 of the communication device 102.

Figure 4:
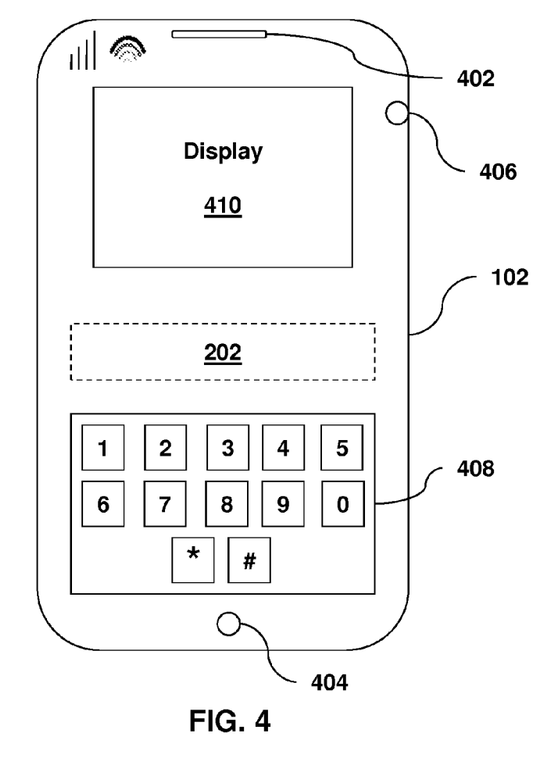
FIG. 4 illustrates the communication device as a mobile phone, in accordance with an embodiment of the invention.

FIG. 4 illustrates communication device 102 as a mobile phone, in accordance with an embodiment of the invention. As shown, communication device 102 may include an earpiece 402, a first microphone 404, a second microphone 406, a display 410, a keypad 408, and wideband noise reducer 202. Further, mobile phone may communicate to another device through a mobile network. Microphone 404 acquires first audio signal buffer 302 and the microphone 406 acquires the second audio signal buffer 304. The audio signal buffers 302 and 304 may be separately converted to digital signals using separate analog to digital converters. People skilled in the art will appreciate that the positions of the first microphone 404 and the second microphone 406 are shown for representation only. The microphones may be positioned such that they are separated from each other. Wideband noise reducer 202 processes first audio signal buffer 302 and second audio signal buffer 304 to generate an enhanced signal that is communicated to the far-end device 108 through a communication channel 112. In an embodiment of the invention, communication device 102 may include a switch (not shown) to activate and/or deactivate wideband noise reducer 202. Therefore, once wideband noise reducer 202 is deactivated, first audio signal buffer 302 and the second audio signal buffer 304 are not processed and the first audio signal buffer 302 is communicated to the far-end device 108 through a communication channel 112.

Figure 5:
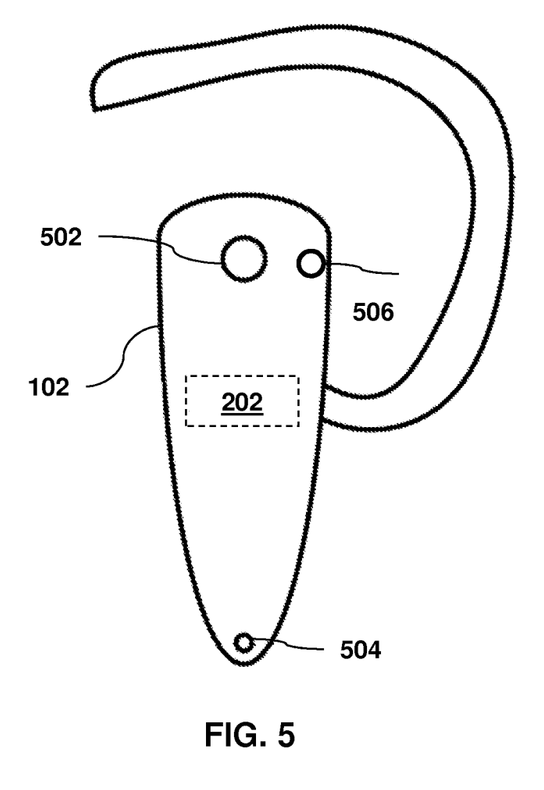
FIG. 5 illustrates the communication device as a headset, in accordance with an embodiment of the invention.

FIG. 5 illustrates communication device 102 as a headset, in accordance with an embodiment of the invention. Communication device 102 may be a Bluetooth headset that can be coupled with a device such as a mobile phone. As shown, the headset may include an earpiece 502, a first microphone 504, a second microphone 506 and wideband noise reducer 202. Microphone 504 acquires first audio signal buffer 302 and the microphone 506 acquires the second audio signal buffer 304. The audio signal buffers 302 and 304 may be separately converted to digital signals using separate analog to digital converters. Wideband noise reducer 202 processes first audio signal buffer 302 and the second audio signal buffer 304 to generate an enhanced signal that is communicated to the far-end device 108 through a communication channel 112. In an embodiment of the invention, communication device 102 may include a switch (not shown) to activate and/or deactivate wideband noise reducer 202. Therefore, once wideband noise reducer 202 is deactivated, first audio signal buffer 302 and the second audio signal buffer 304 are not processed and the first audio signal buffer 302 is communicated to the far-end device 108 through a communication channel 112. People skilled in the art will appreciate that the positions of the first microphone 504 and the second microphone 506 are shown for representation only. The microphones may be positioned such that they are separated from each other.

Figure 6:
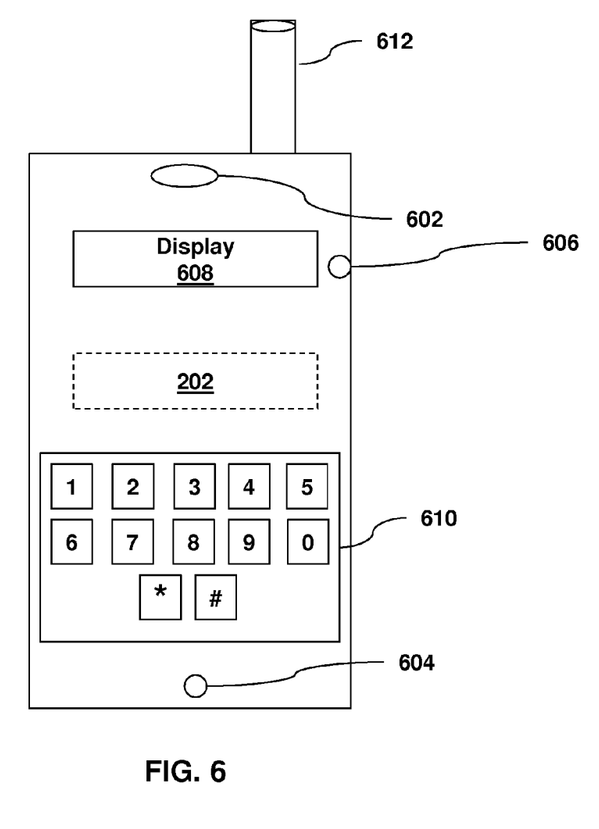
FIG. 6 illustrates the communication device as a cordless phone, in accordance with an embodiment of the invention.

FIG. 6 illustrates communication device 102 as a cordless phone, in accordance with an embodiment of the invention. As shown, the cordless may include an earpiece 602, a first microphone 604, a second microphone 606, a display 608, a keypad 610, an antenna 612 and wideband noise reducer 202. The cordless phone may communicate with a far end device through a docking station (not shown) by using antenna 612. Microphone 604 acquires first audio signal buffer 302 and the microphone 606 acquires the second audio signal buffer 304. The audio signal buffers 302 and 304 may be separately converted to digital signals using separate analog to digital converters. Wideband noise reducer 202 processes first audio signal buffer 302 and the second audio signal buffer 304 to generate an enhanced signal that is communicated to the far-end device 108 through a communication channel 112. In an embodiment of the invention, communication device 102 may include a switch (not shown) to activate and/or deactivate wideband noise reducer 202. Therefore, once wideband noise reducer 202 is deactivated, first audio signal buffer 302 and the second audio signal buffer 304 are not processed and the first audio signal buffer 302 is communicated to the far-end device 108 through a communication channel 112. People skilled in the art will appreciate that the positions of the first microphone 604 and the second microphone 606 are shown for representation only. The microphones may be positioned such that they are separated from each other.

Figure 7:
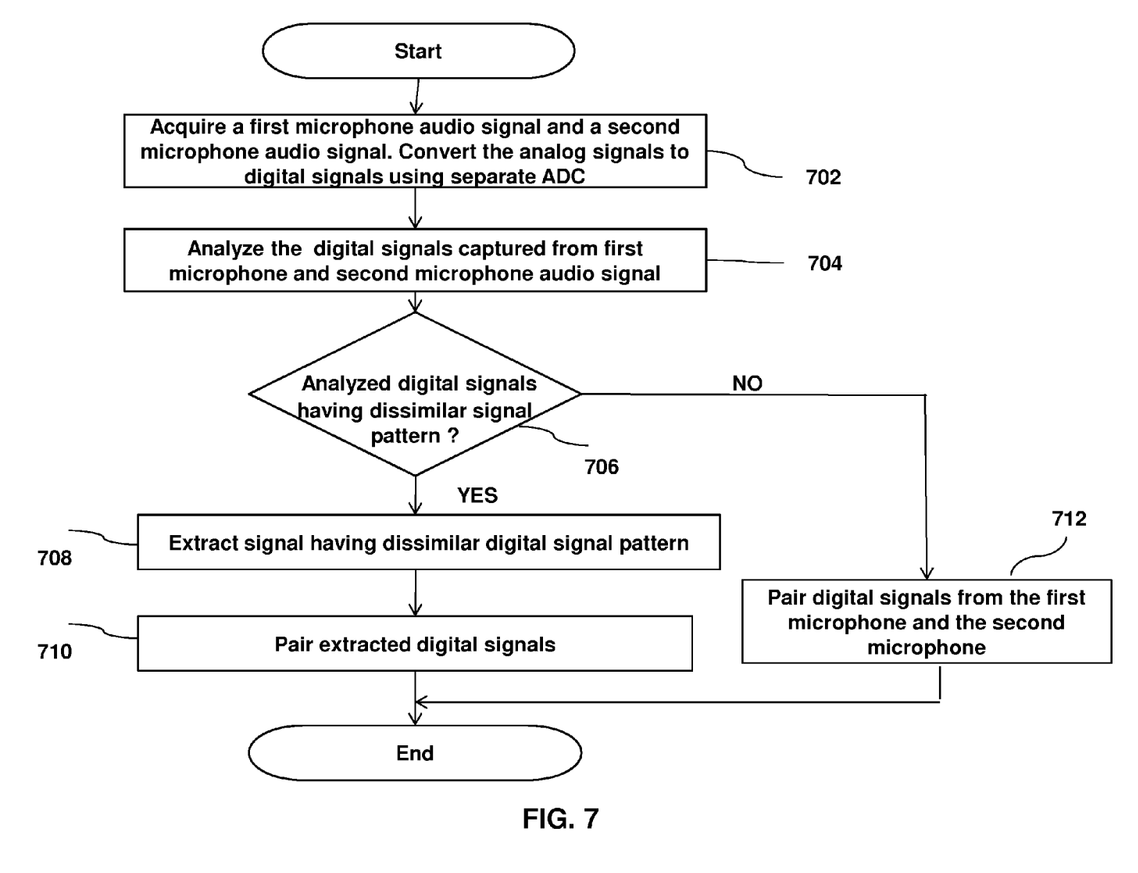
FIG. 7 is a flowchart illustrating the identification of dissimilar digital signal pattern with continually changing properties, extracting and pairing the signals with dissimilar digital signal patterns.

FIG. 7 illustrates the method of reducing stochastic noise from the wideband audio signal. Step 702 involves capturing the first microphone and second microphone wideband analog audio signals. The captured wideband analog audio signals are converted to wideband digital signals using separate analog to digital converters (ADC). At step 704, the processor 204, analyzes the wideband digital signals of the first microphone and the second microphone. If the analyzed wideband digital signals have dissimilar signal pattern with continually changing properties, the processor 204, extracts the signal having dissimilar signal pattern with continually changing properties 708 and pairs the extracted digital signals 710 and transmits the paired digital signal over the communication link 112. If the analyzed wideband digital signals do not have dissimilar signal pattern with continually changing properties, the processor 204, pairs the digital signal of the first microphone and the second microphone 712 and transmits the paired digital signal over the communication link 112.

Figure 8:
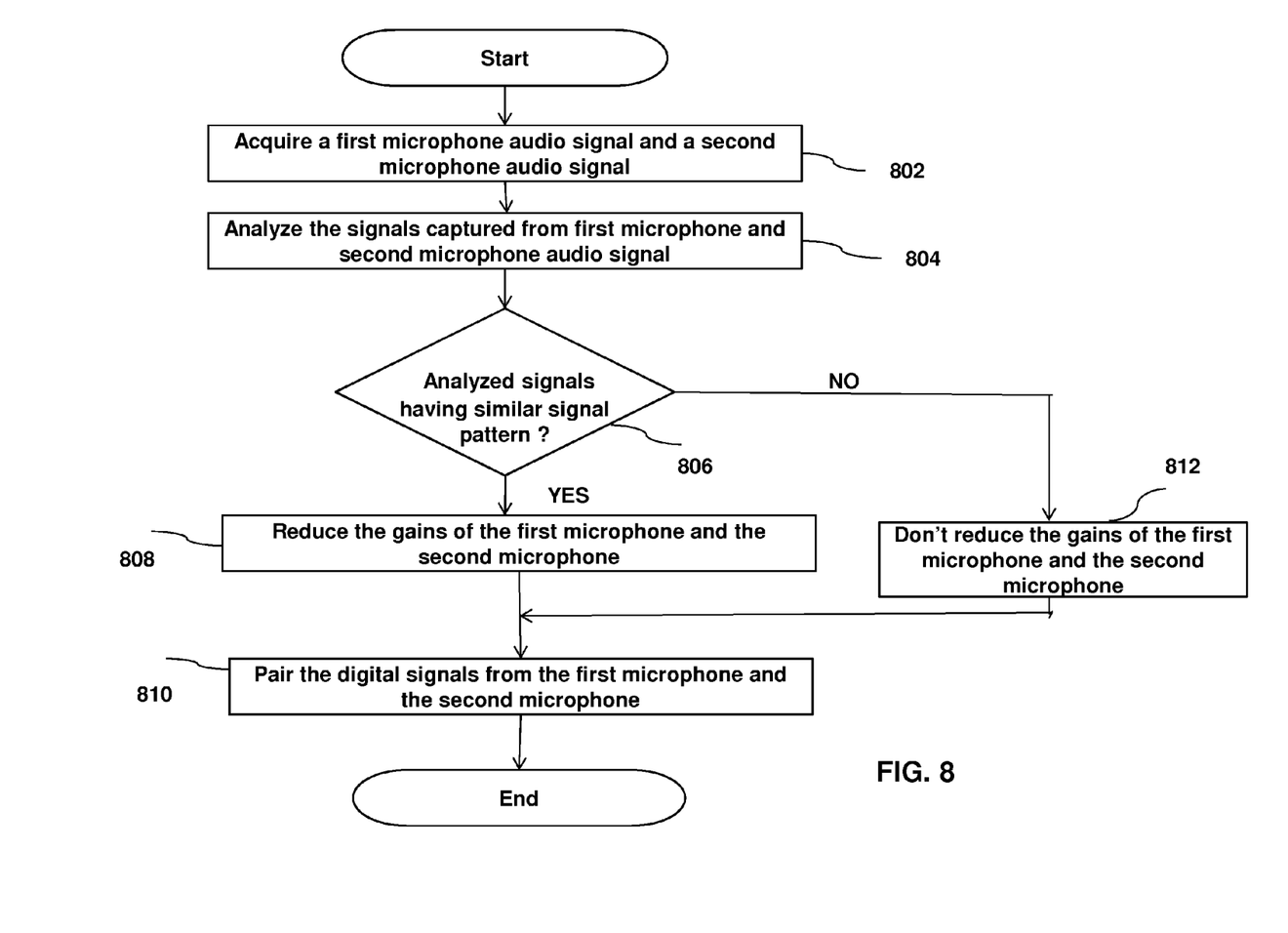
FIG. 8 is a flowchart illustrating the identification of an identical digital signal pattern with continually changing properties, reducing the gains of the first and second microphones and pairing the signals with identical digital signal pattern.

FIG. 8 illustrates the method of reducing stochastic noise from the wideband audio signal. Step 802 involves capturing the first microphone and second microphone wideband analog audio signals. The captured wideband analog audio signals are converted to wideband digital signals using separate analog to digital converters (ADC). At step 804, the processor 204, analyzes the wideband digital signals of the first microphone and the second microphone. If the analyzed wideband digital signals have an identical signal pattern with continually changing properties, the gains of the first microphone and the second microphone are reduced 808 and the processor 204, pairs the digital signals from the first microphone and the second microphone. If the analyzed wideband digital signal does not have an identical signal pattern with continually changing properties, the gains of the first microphone and the second microphone are not changed 812 and the processor 204, pairs the digital signals from the first microphone and the second microphone.

Embodiments of the invention include the following items:

1. A communication device for generating enhanced audio signals, the communication device comprising:
a first microphone for capturing a first wideband analog audio signal;
a second microphone, placed in a position different from the first microphone, for capturing a second wideband analog audio signal;
analog to digital converters for separately converting the first and second wideband analog audio signals into wideband digital signals; and
a processor for analyzing the converted wideband digital signals and controlling the gains of the first microphone and the second microphone if an identical digital signal pattern with continually changing properties is detected.

2. The communication device of 1, wherein the processor analyzes the wideband digital signals and identifies if an identical digital signal pattern with continually changing properties exists.

3. The communication device of 2, wherein the processor reduces the gains of the first microphone and the second microphone if an identical digital signal pattern with continually changing properties is detected.

4. The communication device of 2, wherein the processor does not reduce the gains of the first microphone and the second microphone if an identical digital signal pattern with continually changing properties is not detected.

5. The communication device of 4, wherein the processor pairs the digital signal from the first microphone and the second microphone.

6. A communication device for generating enhanced audio signals, the communication device comprising:
a first microphone for capturing a first wideband analog audio signal;
a second microphone, placed in a position different from the first microphone, for capturing a second wideband analog audio signal;
analog to digital converters for separately converting the first and second wideband analog audio signals into wideband digital signals;
a processor for analyzing the converted wideband digital signals and if a dissimilar digital signal pattern with continually changing properties is detected.

The communication device of 6, wherein the processor analyzes the wideband digital signals and identifies if a dissimilar digital signal pattern with continually changing properties exists.

8. The communication device of 7, wherein the processor pairs the wideband digital signals from the first microphone and the second microphone if a dissimilar digital signal pattern with continually changing properties does not exist.

9. The communication device of 7, wherein the processor extracts signal having dissimilar digital signal pattern and pairs the extracted digital signals, if a dissimilar digital signal pattern with continually changing properties exists.

10. A method performed at a communication device for generating enhanced audio signals, the method comprising:
a first microphone for capturing a first wideband analog audio signal;
a second microphone, placed in a position different from the first microphone, for capturing a second wideband analog audio signal;
analog to digital converters for separately converting the first and second wideband analog audio signals into wideband digital signals;

analyzing the converted wideband digital signals and controlling the gains of the first microphone and the second microphone if an identical digital signal pattern with continually changing properties is detected;

analyzing the converted wideband digital signals and if a dissimilar digital signal pattern with continually changing properties is detected.

11. A method of 10, further comprising analyzing the converted wideband digital signals and if a dissimilar digital signal pattern with continually changing properties is detected; extracts the signal with dissimilar digital signal pattern with continually changing properties; and pair the extracted digital signal.

12. A method of 11, further comprising analyzing the converted wideband digital signals and if an identical digital signal pattern with continually changing properties is detected; reduce the gains of the first microphone and the second microphone if an identical digital signal pattern with continually changing properties is detected; pair the digital signal from the first microphone and the second microphone.

13. A method of 10, further comprising analyzing the converted wideband digital signals and if an identical digital signal pattern with continually changing properties is not detected; does not reduce the gains of the first microphone and the second microphone if an identical digital signal pattern with continually changing properties is not detected; pair the digital signal from the first microphone and the second microphone.

In one embodiment of the present invention, a wideband noise control communication device is disclosed comprising multiple microphones for receiving wideband audio signals. Each microphone is placed in a separate position. A processor is configured to analyze each wideband audio signal received by each microphone and generate unique signal patterns based on each analyzed wideband signals for each microphone. The processor comprises an analog to digital converter for separately converting the wideband analog audio signals received by each microphone, into wideband digital signals. The processor further compares the unique signal patterns to detect any identical signal patterns. A controller is provided for controlling gains of the microphones that are detected to be receiving wideband audio signal of identical signal patterns. The processor analyzes the wideband digital signals and identifies if the detected identical digital signal pattern continually changes its properties.

In one embodiment of the present invention, the controller reduces the gains of the microphones that are detected to be receiving wideband audio signal of identical signal patterns, however, does not reduce the gains of the microphones if no identical signal pattern is detected.

In one embodiment of the present invention, the processor compares the signal patterns in pairs.

In one embodiment of the present invention, a method for controlling wideband communication noise is disclosed. The method comprises the steps of: receiving wideband audio signals via multiple microphones; configuring a processor for: analyzing each wideband audio signal received by each microphone, generating unique signal patterns based on each analyzed wideband signals for each microphone, and comparing the unique signal patterns to detect any identical signal patterns. The method further comprises the steps of controlling gains of the microphones that are detected to be receiving wideband audio signal of identical signal patterns.

What is claimed is:

1. A wideband noise control communication device comprising:
   multiple microphones for receiving wideband audio signals;
   a processor configured to:
      analyze each wideband audio signal received by each microphone,
      generate unique signal patterns based on each analyzed wideband signals for each microphone, and
      compare the unique signal patterns to detect any identical signal patterns;
   a controller for controlling gains of the microphones that are detected to be receiving wideband audio signal of identical signal patterns.

2. The communication device of claim 1, wherein the processor comprises an analog to digital converter for separately converting the wideband analog audio signals received by each microphone, into wideband digital signals.

3. The communication device of claim 1, wherein each microphone is placed in a separate position.

4. The communication device of claim 1, wherein the processor analyzes the wideband digital signals and identifies if the detected identical digital signal pattern continually changes its properties.

5. The communication device of claim 1, wherein the controller reduces the gains of the microphones that are detected to be receiving wideband audio signal of identical signal patterns.

6. The communication device of claim 1, wherein the controller does not reduce the gains of the microphones if no identical signal pattern is detected.

7. The communication device of claim 1, wherein the processor compares the signal patterns in pairs.

8. A method for controlling wideband communication noise, the method comprising the steps of:
   receiving wideband audio signals via multiple microphones;
   configuring a processor for:
      analyzing each wideband audio signal received by each microphone,
      generating unique signal patterns based on each analyzed wideband signals for each microphone, and
      comparing the unique signal patterns to detect any identical signal patterns;
   controlling gains of the microphones that are detected to be receiving wideband audio signal of identical signal patterns.

9. The method of claim 8, wherein the processor comprises an analog to digital converter for separately converting the wideband analog audio signals received by each microphone, into wideband digital signals.

10. The method of claim 8, wherein each microphone is placed in a separate position.

11. The method of claim 8, wherein the processor analyzes the wideband digital signals and identifies if the detected identical digital signal pattern continually changes its properties.

12. The method of claim 8, wherein the controller reduces the gains of the microphones that are detected to be receiving wideband audio signal of identical signal patterns.

13. The method of claim 8, wherein the controller does not reduce the gains of the microphones if no identical signal pattern is detected.

14. The method of claim 8, wherein the processor compares the signal patterns in pairs.

* * * * *